(12) United States Patent
Heinrich et al.

(10) Patent No.: US 8,499,228 B2
(45) Date of Patent: Jul. 30, 2013

(54) METHOD FOR DECODING A SUCCESSION OF BLOCKS ENCODED WITH AN ERROR CORRECTION CODE AND CORRELATED BY A TRANSMISSION CHANNEL

(75) Inventors: Vincent Heinrich, Izeaux (FR); Pascal Urard, Theys (FR)

(73) Assignee: STMicroelectronics SA, Montrouge (FR)

( * ) Notice: Subject to any disclaimer, the term of this patent is extended or adjusted under 35 U.S.C. 154(b) by 357 days.

(21) Appl. No.: 12/914,306

(22) Filed: Oct. 28, 2010

(65) Prior Publication Data

US 2011/0113304 A1    May 12, 2011

(30) Foreign Application Priority Data

Oct. 29, 2009 (FR) ...................... 09 57624

(51) Int. Cl.
*H03M 13/03* (2006.01)
(52) U.S. Cl.
USPC ........................................................ 714/786
(58) Field of Classification Search
USPC ................................................. 714/786, 795
See application file for complete search history.

(56) References Cited

U.S. PATENT DOCUMENTS

| | | | |
|---|---|---|---|
| 7,478,315 B1* | 1/2009 | Hennecken et al. .......... | 714/795 |
| 2007/0127728 A1* | 6/2007 | Hong et al. ..................... | 381/18 |
| 2008/0065970 A1* | 3/2008 | Tan ............................... | 714/800 |
| 2008/0133999 A1* | 6/2008 | Kondo et al. .................. | 714/755 |
| 2008/0152045 A1* | 6/2008 | Efimov et al. .................. | 375/341 |
| 2008/0235561 A1* | 9/2008 | Yang .............................. | 714/801 |
| 2008/0301522 A1* | 12/2008 | Lin et al. ....................... | 714/757 |
| 2009/0070658 A1* | 3/2009 | Patapoutian et al. ......... | 714/795 |
| 2009/0150746 A1* | 6/2009 | Chaichanavong et al. .... | 714/752 |
| 2009/0199073 A1* | 8/2009 | Kanaoka et al. .............. | 714/758 |

FOREIGN PATENT DOCUMENTS

EP    1841073 A1    3/2007

OTHER PUBLICATIONS

Shokrollahi, Amin; LDPC Codes: An Introduction; Apr. 2, 2003.*
Myint et al., "*An Inter-Track Interference Mitigation Technique Using Partial ITI Estimation in Patterned Media Storage*", IEEE Transactions on Magnetics, IEEE Service Center, NY, vol. 45, No. 10, Oct. 2009, pp. 3691-3694.
Xinde Hu et al., "*Evaluation of Low-Density Parity-Check Codes on Perpendicular Magnetic Recording Model*", IEEE Transactions on Magnetics, IEEE Service Center, NY, vol. 43, No. 2, Feb. 2007, pp. 727-732.
Larsson et al., "*Adaptive Equalization for Frequency-Selective Channels of Unknown Length*"; IEEE Transactions on Vehicular Technology, IEEE Service Center, NJ, vol. 54 No. 2, Mar. 2005, pp. 568-579.

* cited by examiner

*Primary Examiner* — Joshua Lohn
(74) *Attorney, Agent, or Firm* — Allen, Dyer, Doppelt, Milbrath & Gilchrist, P.A.

(57) ABSTRACT

A method is for decoding a block of N information items encoded with an error correction code and mutually correlated. The method includes carrying out a first decorrelation of the N information items of a block is carried out, and storing the block decorrelated. The method also includes a performing a processing for decoding a group of P information items of the block, and decorrelating at least part of the P decoded information items. The processing for decoding the group of P information items and the decorrelation are repeated with different successive groups of P information items of the block until the N information items of the block have been processed, until a decoding criterion is satisfied.

20 Claims, 4 Drawing Sheets

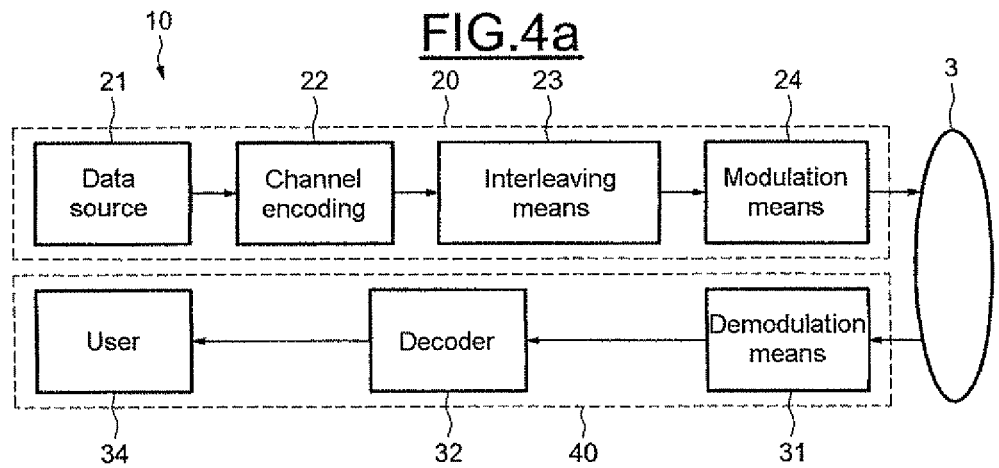
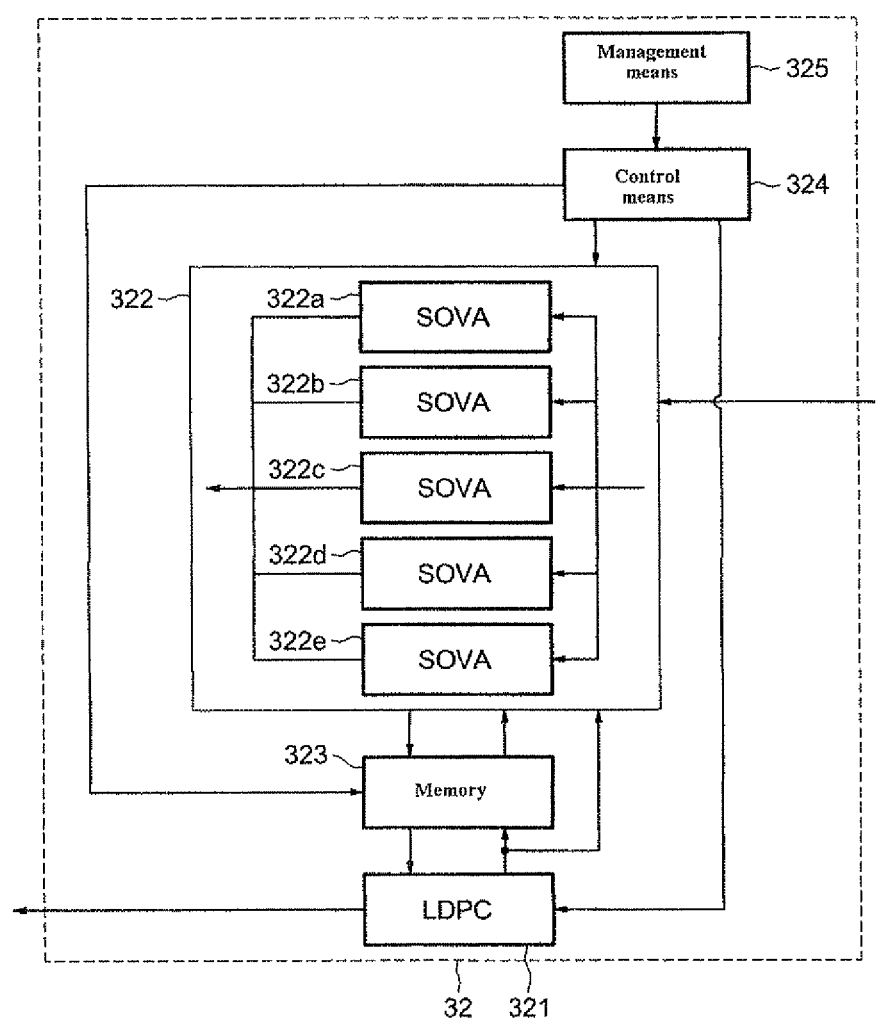

METHOD FOR DECODING A SUCCESSION OF BLOCKS ENCODED WITH AN ERROR CORRECTION CODE AND CORRELATED BY A TRANSMISSION CHANNEL

FIELD OF THE INVENTION

The invention relates to channel decoding, and, more particularly, to the decoding of information blocks previously encoded with the aid of an error correction code having suffered interference during their transmission via a transmission channel in a communication system. The invention relates, in particular, but not exclusively, to the decoding of a signal transmitted in a hard disk between a write chain and a read chain.

BACKGROUND OF THE INVENTION

In the channel coding module of a communication chain, an error correction code, for example an LDPC ("Low Density Parity Check") code, can be used to improve the signal transmission quality. In general, the noise generated by the transmission channel of a communication system is of Gaussian type. In the case of magnetic recording systems, such as hard disks, the magnetic transmission channel delivers noisy information blocks with a large correlation factor. This large correlation factor is mainly due to the interference caused by the physical proximity between the information items written to the hard disk, and the data reading speed. The consequence of this interference is to render the information dependent on the previous information; this is why one speaks of correlated information.

The noise generated by the transmission channel can be modelled on the basis of finite impulse response (FIR) filters by a convolution encoder. On reception, channel decoding operations are performed. Knowing the noise generated by the transmission channel, it is possible to decorrelate the information with the aid of decorrelation circuitry or devices. This decorrelation, which can be performed with a conventional algorithm of the VITERBI type, forms part of the channel decoding. Moreover, the channel decoding comprises a decoding of the blocks encoded with the error correction code to recover the symbols written on the disk.

As indicated above, an exemplary error correction code is a block-based code, such as, for example, the block-based codes whose parity matrix exhibits a low density, that is to say, comprises a low number of 1s. Such codes are better known to the person skilled in the art by the name "LDPC codes" ("Low Density Parity Check").

The LDPC code is a block-based code, and the encoder processes blocks of K bits and delivers blocks of N bits. Thus, N-K redundancy bits are added. These N-K bits are called "parity bits". The coding rate (or "code rate") is defined by the ratio K/N. The lower the coding rate, the higher the number of redundancy bits, and thus the greater the protection against the noise of the transmission channel.

These N-K bits are calculated with the aid of a parity matrix H. This matrix has N-K rows and N columns and includes "1s" and "0s" with a low number of "1s" relative to the number of "0s". This is the reason why codes of this type, based on such a matrix, are dubbed "LDPC codes", that is to say low density codes. The encoded block C, of N bits, is calculated by solving the equation $H \cdot C^T = 0$, where H denotes the parity matrix, and T the "transpose" function.

On the decoder side, the correction of the erroneous bits is performed on the basis of the relations between the coded information items of the block. These relations are given by the parity matrix H. The decoder uses internal metrics corresponding to the "1s" of the matrix H. The matrix H corresponds to the Tanner graph of the LDPC code comprising so-called check nodes and information nodes (or "bit nodes") linked together by the path of the graphs that are representative of the messages iteratively exchanged between the nodes thus linked. These metrics are updated row-wise (updating of the check nodes) taking into account the internal metrics of one and the same row. Thereafter, the decoder updates these metrics column-wise (updating of the information nodes) taking into account the internal metrics on one and the same column as well as the corresponding information input to the decoder and originating from the transmission channel. An iteration corresponds to the updating of the check nodes for all the internal metrics, followed by the updating of the information nodes for all the internal metrics.

The decoding of a block involves several iterations. The values, also called "hard decisions," of the decoded bits are obtained by adding the internal metrics column-wise with the information received and by taking the sign of the result. This result is also denoted by the term "soft decision" or "LLR" (Log Likelihood Ratio). The sign of the result provides the "0" or "1" value of the bit ("hard decision") while the absolute value of the result gives a confidence indication (probability) for this "0" or "1" logic value.

Codes of the LDPC type are beneficial since they make it possible to obtain a very low bit error rate (BER), because of the iterative character of the decoding algorithm. Several iterative decoding algorithms exist for decoding LDPC codes. Mention may in particular be made of the conventional so-called "belief propagation" (BP) algorithm, well known to the person skilled in the art.

The duration of decoding of a block is directly related to the number of iterations. Thus, to achieve a given throughput, a maximum number of iterations is defined for each coding rate and each block may be decoded with this maximum number of iterations. For example, the maximum number of iterations can be fixed at 50. That said, if the decoding has not converged after these 50 iterations, then this results in a decrease in the decoding performance.

As indicated above, the decorrelation of the information of a block can be performed with the aid of decorrelation means, circuitry, or devices such as a Viterbi decoder. This decoder based on a Viterbi algorithm makes it possible to decode an information block coded on the basis of an error correction based on a convolution code.

It is possible to use a SOVA (Soft Output Viterbi Algorithm) decoder which is a variant of the conventional Viterbi algorithm which is generally implemented as an algorithm with two steps, with a Viterbi algorithm part and a part concerning itself with calculating the probabilities (soft-output). The first step of a SOVA is to select the most probable sequence making it possible to pass through a single node of a trellis at each instant. Each node possessing at least two branches converging on the node, one of them being chosen in the said sequence, the difference between the value carried on each branch indicates the error rate of each choice. The value thus carried on each branch, also called the branch metric, is accumulated throughout the calculations so as to indicate the probability of confidence of the value of the decoded bit (hard decision).

In a general case where a SOVA decoder and an LDPC decoder are used to perform the channel decoding, it is possible to carry out a few external iterations corresponding to a "SOVA decoder—LDPC decoder" loop iteration and about B LDPC decoder iterations for each external iteration to obtain a satisfactory correction capability.

Moreover, the disks require a high transmission throughput, of the order of 4 Gbits/s. In order to obtain such a throughput, a known solution consists in running the external loop by effecting a series coupling of several SOVA decoders and of several LDPC decoders.

The decoders being designed on an imperfect channel model, it is helpful to increase the number of external iterations to improve the quality of the decoding. The corrections afforded by one type of decoder do indeed make it possible to improve the correction performed by the other type of decoder. For this purpose, one of the approaches includes increasing the number of SOVA decoders and LDPC decoders. Otherwise it is helpful to decrease the transmission throughput. Moreover, it has been noted that it is preferable to have a bigger number of external iterations even if the number of LDPC iterations is decreased accordingly.

According to one mode of implementation and embodiment, it is proposed that decorrelation circuitry, such as SOVA decoders, and error correction code decoding circuitry, such as an LDPC decoder, be coupled so as to carry out an LDPC decoding of a group of information items of a block followed by a decorrelation with the aid of a plurality of SOVA decoders of at least part of the data thus decoded before carrying out an LDPC decoding of a new group of information items of the same block. This new decoder thus effected by merging an LDPC decoder with a plurality of SOVA decoders in parallel makes it possible to increase the number of iterations regarded as external iterations, given that the new decoder can be considered to be a single LDPC decoder whose channel information is updated during the LDPC decoding, thus making it possible to increase the decoding performance while preserving a smaller area of occupancy than in the case of using several LDPC decoders and several SOVA decoders.

SUMMARY OF THE INVENTION

According to one aspect, there is a method for decoding a block of N information items encoded with an error correction code and mutually correlated. The method includes carrying out a first decorrelation of the N information items of the block is carried out. The block thus decorrelated is stored. A processing for decoding a group of P information items of the block is then performed. At least part of the P decoded information items is decorrelated. The processing for decoding the group of P information items and the decorrelation of at least part of the P decoded information items are repeated with different successive groups of P information items of the block until the N information items of the block have been processed, until a decoding criterion is satisfied.

In the course of an iteration, the fact of being able to decorrelate the information items which have already been decoded, that is to say of having an order of decoding of the information items which is identical to the order of decorrelation of the information items results in particular from an initial interleaving of the information items of the block. Stated otherwise, the information items received are then already interleaved to allow the succession the above steps.

Preferably, the error correction code comprises check nodes and information nodes linked according to a defined connectivity, the group of P information items comprises information items relating to at least one check node and to the information nodes connected to this check node, and the decoding processing comprises an updating of the check node and information nodes which are connected to it. It is advantageously possible to decorrelate in all the P decoded information items of the group.

The minimum number of information items of a group of P information items is equal to the degree of checking of the error correction code corresponding to the number of information nodes to which a check node is linked. The degree of checking of the error correction code corresponds to the number of information nodes to which a check node is linked.

Preferably, the error correction code is a code of the LDPC type. Preferably, the information items are decorrelated with the aid of a Viterbi algorithm of SOVA type.

According to another aspect, there is proposed, in one embodiment, a decoding device comprising an input for receiving a block of N information items encoded with an error correction code and mutually correlated, decorrelation circuitry able to decorrelate the block, memory circuitry able to store the block, and decoding circuitry of the error correction code able to decode the block in an iterative manner.

The decoder furthermore comprises control circuitry able to activate the decorrelation circuitry so as to carry out a first decorrelation of the N information items of the block, to activate the storage circuitry so as to store the block thus decorrelated, to activate the decoding circuitry so as to perform a processing for decoding a group of P information items of the block. The control circuitry is also able to activate the decorrelation circuitry so as to decorrelate at least part of the P decoded information items, and to repeat these activations with different successive groups of P information items of the block until the N information items of the block are processed. Management circuitry is able to activate the control circuitry until a decoding criterion is satisfied.

Preferably, the error correction code comprises check nodes and information nodes linked according to a defined connectivity, the group of P information items comprises information items relating to at least one check node and to the information nodes connected to this check node, and the decoding device is able to perform an updating of the at least one check node and information nodes which are connected to it.

Advantageously, the decorrelation circuitry can comprise a plurality of decorrelation modules coupled together in parallel, the number of decorrelation modules corresponding at most to a number of P information items included in a group of a block. Preferably, the circuitry for decoding of the error correction code forms LDPC code decoding circuitry.

A group of P information items can advantageously comprise a number of information items at least equal to the degree of checking of the error correction code. The decorrelation modules preferably form channel decoding circuitry based on a Viterbi algorithm of SOVA type.

According to another aspect, there is a receiver of a communication system comprising a decoding device such as described above. According to yet another aspect, there is a communication system comprising a transmitter having circuitry for encoding the information items with an error correction code, a receiver such as described above, and a transmission channel. Preferably, the communication system is a magnetic recording system such as a hard disk.

BRIEF DESCRIPTION OF THE DRAWINGS

Other advantages and characteristics of the invention will be apparent on examining the detailed description of wholly non-limiting embodiments and modes of implementation, and the appended drawings in which:

FIGS. 4a and 4b illustrate in greater detail, but still schematically, an embodiment of a communication system and an embodiment of a decoder according to the invention.

DETAILED DESCRIPTION OF THE PREFERRED EMBODIMENTS

Figure 1:
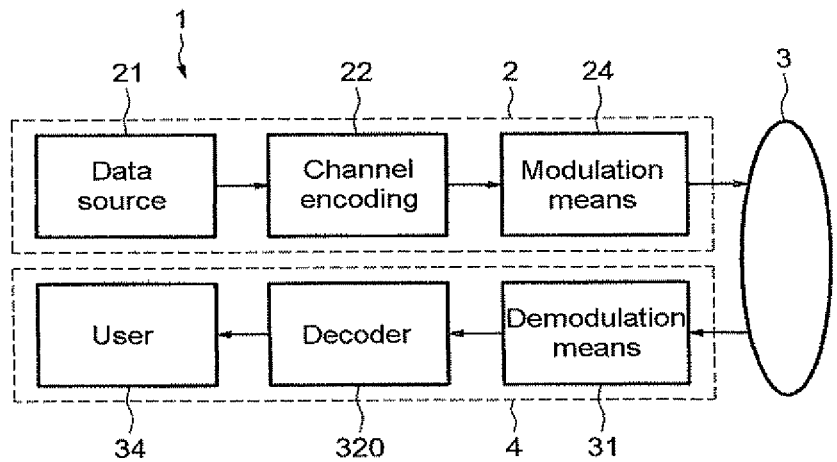
FIG. 1 schematically illustrates an exemplary internal structure of a communication system according to the prior art.

In FIG. 1, has been represented in a schematic manner a communication system 1 such as a hard disk.

The communication system 1 comprises a transmission chain 2, such as a write chain for a hard disk, capable of transmitting coded and modulated information on a transmission channel 3.

Moreover, this communication system 1 also comprises a reception chain 4, such as a read chain for a hard disk, capable of receiving and decoding information originating from the transmission channel 3.

The transmission chain 2 comprises a source of information 21 able to generate a succession of information blocks intended to be transmitted, and that can comprise information compression circuitry able to increase the information throughput.

The transmission chain 2 also comprises channel encoding circuitry 22 whose function is in particular to add redundancy so as to be able subsequently to correct the potential reception errors due to the noise of the transmission channel. The channel encoding circuitry 22 comprises for example LDPC coding circuitry. Finally the transmission chain 2 comprises modulation means, circuitry, or devices 24, such as a hard disk write head, able to adapt the signal to the transmission channel 3.

The reception chain 4 comprises homologous means, circuitry, or devices performing the inverse functions. More precisely, first of all there are demodulation means, circuitry, or devices 31 such as a hard disk read head.

The information is thereafter delivered to channel decoding means, circuitry, or devices 320 making it possible to decode the information blocks previously encoded with the error correction code and having suffered possible disturbances during the transmission via the transmission channel 3. The information thus decoded is ultimately delivered to an information user 34 that can comprise decompression means, circuitry, or devices making it possible to decompress the optionally compressed information.

Figure 2:
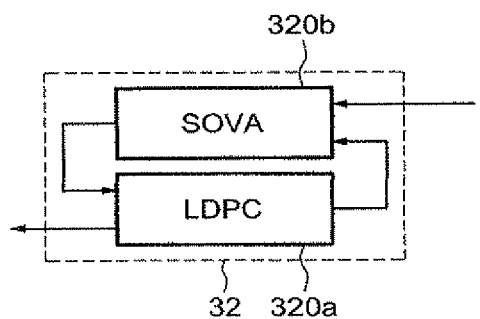
FIG. 2 illustrates in greater detail, but still schematically, a channel decoder according to the prior art.

In the prior art illustrated in FIG. 2, it is known to form channel decoding means, circuitry, or devices 320 by coupling means, circuitry, or devices of decoding of the error correction code such as an LDPC decoder 320a with decorrelation means, circuitry, or devices such as a SOVA decoder 320b. The coupling is carried out so as to form a loop.

Figure 3:
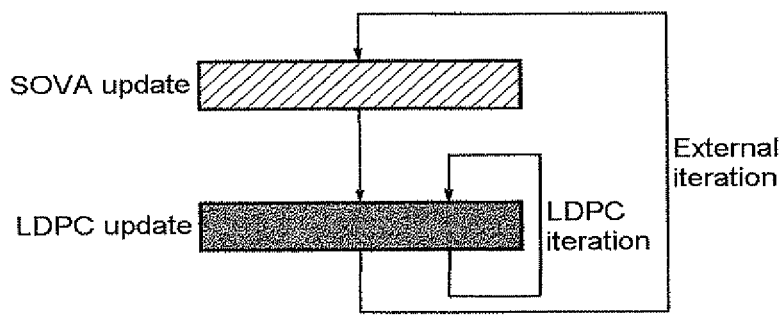
FIG. 3 is a flowchart representative of a channel decoding method according to the prior art.

FIG. 3 represents a flowchart representative of the decoding method used in the prior art. Conventionally, the SOVA decoder 320b carries out first of all an update (decoding of VITERBI type) of the information items of a block. The block is thereafter transmitted to the LDPC decoder 320a which performs an LDPC decoding of the information items of the block delivered by the SOVA decoder during several iterations (in general 8 iterations) dubbed LDPC iterations. Once the plurality of LDPC iterations has been carried out, the information items thus updated (decoded) output by the LDPC decoder 320a are thereafter returned during an external iteration to the SOVA decoder 320b for a new SOVA update (new decoding). The looping is thus carried out until a code word is decoded. The decoding of a code word is detected on the basis of a conventional checking method, not described, or else the code word can be considered to be decoded after a given number of external iterations have been carried out.

In FIG. 4a has been represented in a schematic manner a communication system 10 according to the invention. The elements similar to those of FIG. 1 bear the same references.

Thus, the communication system 10 comprises a transmission chain 20, such as a write chain for a hard disk, capable of transmitting coded and modulated information on a transmission channel 3, as well as a reception chain 40, such as a read chain for a hard disk, capable of receiving and decoding information originating from the transmission channel 3.

At the output of the channel encoding means 22, the transmission chain 20 also comprises interleaving means, circuitry, or devices 23 able to arrange the order of the information items in the block according to a desired order.

The interleaving means, circuitry, or devices 23 furthermore make it possible to protect the data from pointlike errors in the transmission channel 3. The pointlike errors may overlap several adjacent data. By ordering the data for transfer via the transmission channel 3 according to a given order making it possible not to have two initially adjacent data side by side, the pointlike errors may not affect a group of adjacent data in the initial order. Thus, by arranging the data again according to the initial order during decoding, the errors have not affected several adjacent data, thus creating fewer decoding problems.

Instead of the decoder 320, the reception chain 40 comprises channel decoding means, circuitry, or devices 32. FIG. 4b represents in a schematic manner an embodiment of decoding means, circuitry, or devices 32, or decoder.

In this embodiment, the decoder 32 (channel decoder) comprises, first of all, error correction code decoding means, circuitry, or devices which are, in this example, an LDPC decoder 321. The decoder 32 comprises, moreover, decorrelation means, circuitry, or devices 322 which comprise a plurality of decorrelation modules such as SOVA decoders 322a to 322e. In this example, five SOVA decoders 322a to 322e have been represented in a nonlimiting manner.

The SOVA decoders 322a to 322e of the decorrelation means, circuitry, or devices 322 are coupled together in parallel so as to work simultaneously, each on part of the information items of a block of N information items.

The decoder 32 receives as input a block of N information items which is fed to the decorrelation means, circuitry, or devices 322. Storage means, circuitry, or devices 323 making it possible to store the information blocks successively and temporarily are coupled, first of all, between the output of the decorrelation means, circuitry, or devices 322 and the input of the LDPC decoder 321, and on the other hand, between the output of the LDPC decoder 321 and the input of the decorrelation means, circuitry, or devices 322. The LDPC decoder 321 also comprises a direct coupling to the decorrelation means, circuitry, or devices 322 making it possible to transmit a certain number of information items without time lag due to the storage means, circuitry, or devices 323.

The LDPC decoder 321 also comprises another output making it possible to deliver the decoded blocks as output from the decoder 32. The storage means, circuitry, or devices can comprise two distinct storage modules, a first module coupled between the decorrelation means, circuitry, or devices 322 and the LDPC decoder 321, and a second module coupled between the LDPC decoder 321 and the decorrelation means, circuitry, or devices 322.

The storage means, circuitry, or devices 323 make it possible to store the following information items processed by the LDPC decoder 321, for example, although the decorrelation means, circuitry, or devices 322 have not had time to update the information items previously processed by the LDPC decoder 321. They also make it possible to store the following information items processed by the decorrelation means, circuitry, or devices 322, for example, although the LDPC decoder 321 has not had time to process the information items previously updated by the decorrelation means, circuitry, or devices 322.

Finally the decoder 32 comprises control means, circuitry, or devices 324 able to control the decorrelation means, circuitry, or devices 322, the storage means, circuitry, or devices 323 and the error correction code decoding means, circuitry, or devices 321, and management means, circuitry, or devices 325 making it possible to control the control means, circuitry, or devices 324. The control means, circuitry, or devices 324 make it possible in particular to address the memory so as to make it possible to perform the data reordering explained above.

The control means, circuitry, or devices 324 also make it possible to activate the decorrelation means, circuitry, or devices 322 so as to carry out a first decorrelation of the N information items of the block, to activate the storage means, circuitry, or devices 323 so as to store the decorrelated block, to activate the decoding means, circuitry, or devices 321 for the processing for decoding a group of P information items of the block, and then to activate the decorrelation means, circuitry, or devices 322 so as to decorrelate at least part of the P decoded information means, circuitry, or devices, and to repeat the commands with different successive groups of P information items of the block until the N information items are processed.

Figure 5:
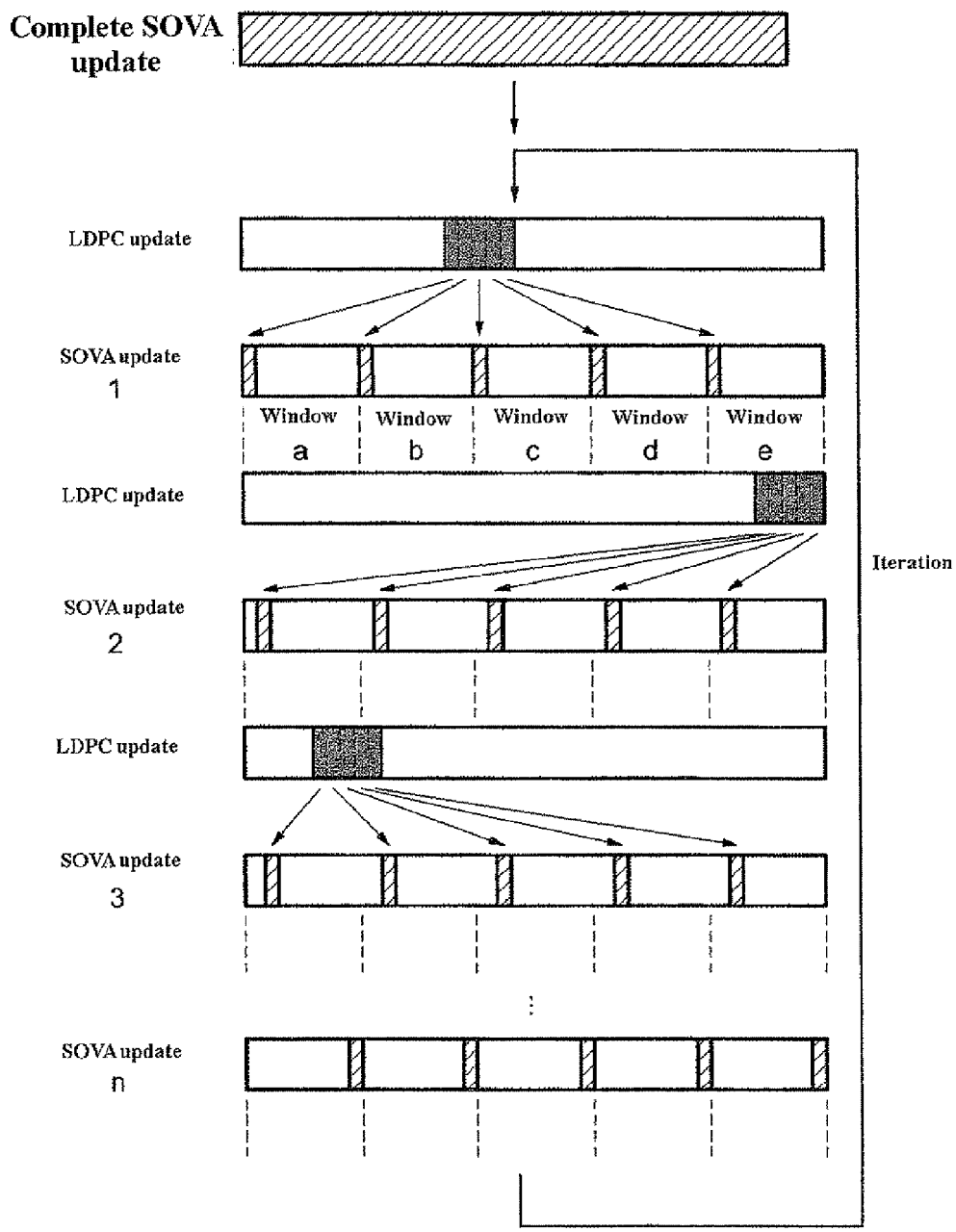
FIG. 5 is a flowchart representative of a mode of implementation of a decoding method according to the invention.

The management means, circuitry, or devices 325 make it possible to repeat the control of the control means, circuitry, or devices 324 until a decoding criterion is satisfied. FIG. 5 is a flowchart representative of a mode of implementation of a decoding method according to the invention which will make it possible to understand the manner of operation of the decoder 32 described in FIG. 4.

In a first step of the mode of implementation of the decoding method, the decorrelation means, circuitry, or devices 322 carry out a complete update of the N information items included in a block received as input to the decoder 32. This complete SOVA update is carried out by the SOVA decoders 322a to 322e which each work on a window of the equivalent information block.

Indeed, placing SOVA decoders in parallel makes it possible to process information items simultaneously. To thus optimize the SOVA update, the information block is divided into work windows of equal sizes. In this example, each of the five SOVA decoders 322a to 322e processes the information items of a work window Window a to Window e comprising $\frac{1}{5}^{th}$ of the N information items.

A SOVA decoder consecutively processes the information items in the order in which they are found. Hence, the SOVA decoders 322a to 322e decode the first information item of their work window, and then the following information items until the last one of their work window.

Once the complete SOVA update has been carried out in parallel by the five SOVA decoders 322a to 322e of the decorrelation means, circuitry, or devices 322, the information items which have been decorrelated thus a first time are delivered to the LDPC decoder 321 via the storage means, circuitry, or devices 323 which make it possible to retain in memory the information items updated by the decorrelation means, circuitry, or devices 322 while the LDPC decoder 321 is processing the previous information items.

Figure 7:
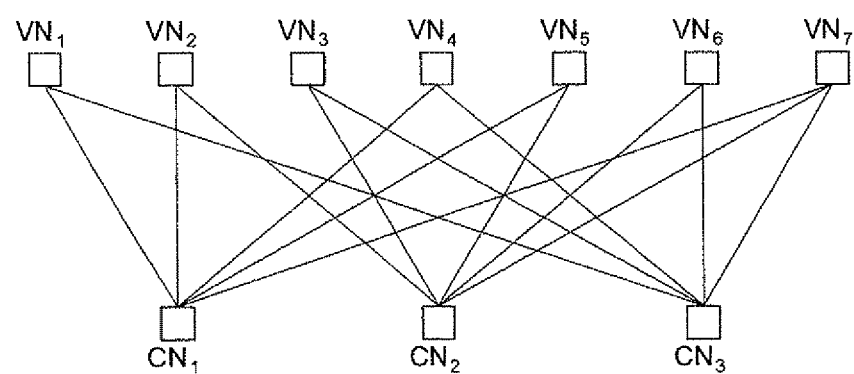
FIG. 7 presents an exemplary Tanner graph.

Unlike the SOVA decoders 322a to 322e which process the information in a linear manner, the LDPC decoder 321 processes the information in a non-linear manner according to a known scheme (also called a Tanner graph) an example of which is represented in FIG. 7. The graph of the error correction code comprises check nodes CN and information nodes VN ("Variable Nodes") linked according to a defined connectivity. A group of P information items thus comprises information items relating to at least one check node CN and to the information nodes VN connected to this check node CN.

The information items of a block are not organized in the same manner upon their receipt by a SOVA decoder, which processes the information items in a linear manner without modifying their organization upon their receipt, or by an LDPC decoder.

An LDPC decoder organizes the information in the form of a matrix comprising N columns and a number of rows equal to the number of redundancies included in the N information items of the block. This number of redundancies is equivalent to the number of check nodes of the Tanner graph. Each row of the matrix therefore corresponds to a check node of the LDPC code. Thus at each LDPC update, one or more check nodes are updated. Therefore, one or more rows of the matrix is or are processed per LDPC update.

During an update of one or more check nodes, this update makes it possible to process a number P of information items of a group. Subsequent to the updating of one or more check nodes, the information nodes (or "variable nodes") of the Tanner graph, coupled to these check nodes, are partially updated on the basis of the information items of the check nodes. Each information node is coupled to several check nodes. This is why, subsequent to an update of a check node, the update of an information node is only partial.

The interleaving carried out in the transmitter 20 by the interleaving means, circuitry, or devices 23 makes it possible to order the information in such a way that at least part of the P decoded information items of the first row of the matrix processed during the LDPC update correspond to the first information item of each window processed during the first SOVA partial update. In the course of an iteration, the fact of being able to decorrelate the information items which have already been decoded, that is to say of having an order of decoding of the information items which is identical to the order of decorrelation of the information items, results in particular from the initial interleaving of the information items of the block. Stated otherwise, the information items received are then already interleaved to allow the successive decodings and decorrelations.

The person skilled in the art will be able to parameterize this interleaver 23 to obtain the desired order having regard to the knowledge of the order of processing of the information items of the LDPC decoder 321.

Thus as indicated in FIG. 4b, the LDPC decoder 321 receives the block of N information items updated by the decorrelation means, circuitry, or devices 322, and decodes a first group of P information items of the block. The number P of information items included in a group of the block is smaller than the number N of information items contained in a block and is at least equal to the number of SOVA decoders included in the decorrelation means, circuitry, or devices 322.

In this example, the LDPC decoder 321 decodes in groups of P=5 information items. The five decoded information items of the first group correspond to the first information item of each of the five work windows from Window a to Window e of the five SOVA decoders 322a to 322e.

In the case where the number P of decoded information items of the first group is greater than the number of SOVA decoders at least part of the decoded information items of the first group correspond to the first information items of each work window of the SOVA decoders 322a to 322e.

Part of the information items of the first group of the block thus decoded is thereafter returned directly to the decorrelation means, circuitry, or devices 322 so as to perform a first partial update, denoted SOVA Update 1. This first partial update corresponds to the SOVA update of the first information items of each work window Window a to Window e. Another part of information items comprising the remainder of the decoded information items of the first group is returned to the storage means, circuitry, or devices 323 which store these information items thus decoded. These information items will subsequently be used in the decoding by the LDPC decoder 321, without having been updated by the decorrelation means, circuitry, or devices 322, this, of course, in the case where the LDPC decoder 321 processes more information items at one and the same time than the decorrelation means, circuitry, or devices 322. The information items not updated this time by the decorrelation means, circuitry, or devices 322 will subsequently be so following one of the decoding iterations of the LDPC decoder 321.

Once the first partial update has been carried out, the block partially updated by the decorrelation means, circuitry, or devices 322, comprising the first information item of each work window thus updated, is delivered to the LDPC decoder 321 via the storage means, circuitry, or devices 323 so as to effect a decoding of a second group of P information items.

In the example illustrated, the five information items of the second group decoded by the LDPC decoder 321 correspond to the second information item of each of the five work windows from Window a to Window e of the five SOVA decoders 322a to 322e.

If the first group of P information items did not comprise the second information items of each work window, then at least part of the information items of the second group corresponds to the second information items of each work window of the SOVA decoders 322a to 322e.

The SOVA decoders work in a linear manner and successively process the information items in the order in which they are arranged in their work window. To optimize the processing of the information items by the decoder 32, the information items of each work window are therefore decoded by the LDPC decoder 321 before being decorrelated by the SOVA decoders 322a to 322e. This is why it is advantageous to carry out a decoding of the information items by the LDPC decoder 321 in the order in which the information items are processed by the decorrelation means, circuitry, or devices 322.

For this purpose, the N information items of the block have been initially sorted by the interleaving means, circuitry, or devices 23 of the transmission chain 20 in such a way that the first information item of each processing window of the decorrelation means, circuitry, or devices 322 is included in the first group of P information items processed by the LDPC decoder 321.

If the group of P information items comprises more information items than the decorrelation means, circuitry, or devices 322 comprise SOVA decoders, the second information item of each processing window can already be included in the first group of P information items. In this case, the second information item of each work window will be updated by the decorrelation means, circuitry, or devices 322 during the second SOVA update, denoted SOVA Update 2. Before the second LDPC update, the LDPC decoder 321 would have processed a group of P information items corresponding to the following information items of each work window not included in the first group of P information items. Thus, if the first group of P information items comprises the first and second information items of each work window, the second group of P information items that is processed by the LDPC decoder will comprise the third and fourth information item of each work window.

In FIG. 5, it is therefore indeed helpful to consider that the N information items are not organized in the same manner during a SOVA partial update and during an LDPC update.

The information items are thus decoded successively with the aid of the LDPC decoder 321 and decorrelated by the SOVA decoders 322a to 322e. Once the last partial update (SOVA Update n) has been carried out, that is to say once the last information item of each work window has been processed by the SOVA decoders 322a to 322e, a looping is carried out so as to recommence a new succession of partial updates of the information items by the decorrelation means, circuitry, or devices 322 and the decoding means, circuitry, or devices 321.

It should be noted that if the groups of P information items comprise more information items than the decorrelation means, circuitry, or devices 322 can update information items, that is to say if the number P of information items is greater than the number of SOVA decoders included in the decorrelation means, circuitry, or devices 322, the LDPC decoder 321 carries out several decodings of the groups of P information items constituting the block of N information items while the decorrelation means, circuitry, or devices 322 carry out an update of the N information items of the block.

Figure 6:
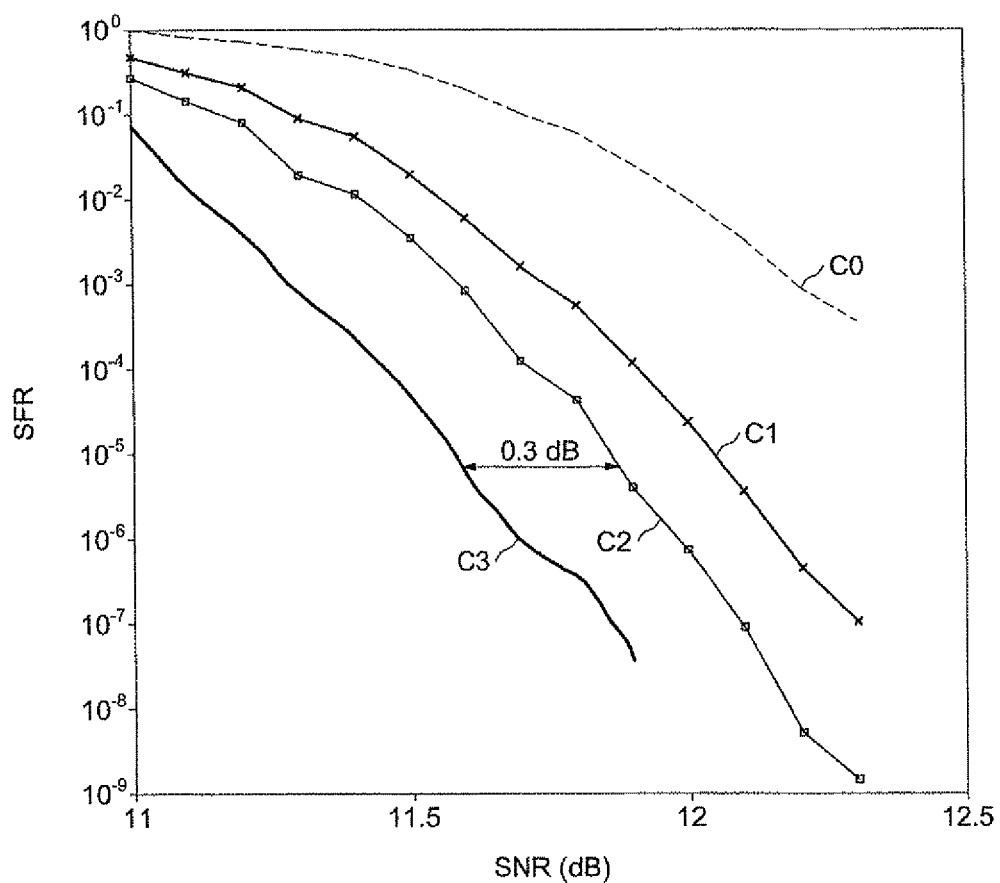
FIG. 6 is a curve showing advantages of the invention.

FIG. 6 illustrates the evolution of the sector error rate (or Sector Failure Rate, SFR) as a function of the signal-to-noise ratio (SNR).

Curve $C_0$ shown dashed represents the evolution for a decoder according to the prior art, after a single external iteration.

Curve $C_1$ shown solid and marked with crosses represents the evolution for a decoder according to the prior art after two external iterations.

Curve $C_2$ shown solid and marked with squares represents the evolution for a decoder according to the prior art, after three external iterations.

Finally, curve $C_3$ shown solid and without marks represents the evolution for a decoder 32, according to the invention, comprising decorrelation means, circuitry, or devices comprising nineteen SOVA decoders mounted in parallel and groups of P=4×38=152 information items. In the case presented, the frame comprises N=4864 information items. The degree of connection of the check nodes is constant and equals 38 for all the check nodes. In the example illustrated, the decoder 32 processes the rows four by four, that is to say it performs the update of four check nodes in one processing. This is why the groups of information items comprise P=4×38=152 information items.

It is observed from the curves that the sector error rate is markedly lower for a decoder 32 according to the invention than for a decoder according to the prior art for one and the same signal-to-noise ratio. Looking, for example, at SNR=11.5, the sector error rate is two orders of magnitude smaller for a decoder 32 according to the invention than a decoder according to the prior art after three external iterations.

Considering the picture from a user point of view, it may be seen that for a given sector error rate, which may correspond to the maximum desired by the user, the signal-to-noise ratio is 0.3 dB smaller for the decoder 32 according to the invention than for the decoder according to the prior art after three external iterations. Thus the decoder 32 according to the invention can process a noisier signal than a decoder according to the prior art without the sector error rate exceeding the maximum sector error rate desired by the user.

That which is claimed:

1. A method for decoding a block of N information items encoded with an error correction code and mutually correlated comprising:
   a) performing a first decorrelation of the block of N information items to thereby generate a decorrelated block;
   b) storing the decorrelated block;
   c) decoding a group of P information items of the decorrelated block;
   d) decorrelating all of the group of P decoded information items using a plurality of decorrelation modules coupled in parallel, a number of the plurality of decorrelation modules corresponding to a number of the P decoded information items;
   e) repeating c) and d) with different successive groups of P information items of the decorrelated block until the N information items have been decoded and decorrelated; and
   f) repeating e) until a decoding criterion is satisfied.

2. A method according to claim 1, wherein the error correction code comprises a plurality of check nodes and a plurality of information nodes linked according to a defined connectivity, wherein the group of P information items comprises information items relating to at least one of the plurality of check nodes and to information nodes connected thereto, and wherein the decoding performed at c) comprises updating the at least one check node and the information nodes connected thereto.

3. A method according to claim 1, wherein the error correction code comprises a low-density parity-check (LDPC) error correction code.

4. A method according to claim 1, wherein the N information items of the block are decorrelated using a soft output Viterbi algorithm.

5. A method for decoding a block of N information items encoded with a low-density parity-check (LDPC) error correction code and mutually correlated comprising:
   a) performing a first decorrelation of the block of N information items to thereby generate a decorrelated block;
   b) storing the decorrelated block;
   c) decoding a group of P information items of the decorrelated block;
   d) decorrelating all of the group of P decoded information items using a plurality of soft output Viterbi algorithm decorrelation modules coupled in parallel, a number of the plurality of decorrelation modules corresponding to a number of the P decoded information items;
   e) repeating c) and d) with different successive groups of P information items of the decorrelated block until the N information items have been decoded and decorrelated; and
   f) repeating e) until a decoding criterion is satisfied.

6. A method according to claim 5, wherein the LDPC error correction code comprises a plurality of check nodes and a plurality of information nodes linked according to a defined connectivity, wherein the group of P information items comprises information items relating to at least one of the plurality of check nodes and to information nodes connected thereto, and wherein the decoding performed at c) comprises updating the at least one check node and the information nodes connected thereto.

7. A decoding device for use in an electronic device comprising:
   an input configured to receive a block of N information items encoded with an error correction code and mutually correlated;
   decorrelation circuitry comprising a plurality of decorrelation modules coupled in parallel to decorrelate the block, thereby generating a decorrelated block, a number of said plurality of decorrelation modules corresponding to a number of the P decoded information items;
   a memory configured to store the decorrelated block;
   decoding circuitry configured to decode the error correction code to thereby decode the decorrelated block in an iterative manner;
   control circuitry configured to
      activate said decorrelation circuitry so as to carry out a first decorrelation of the N information items of the decorrelated block,
      activate said memory so as to store the decorrelated block,
      activate said decoding circuitry so as to decode all of P information items of the decorrelated block,
      activate said decorrelation circuitry so as to decorrelate all of the P decoded information items, and
      repeat the activation of said decorrelation circuitry, said memory, said decoding circuitry, and said decorrelation circuitry with different successive groups of P information items of the decorrelated block until the N information items are processed; and
   management circuitry configured to activate said control circuitry until a decoding criterion is satisfied.

8. A decoding device according to claim 7, wherein the error correction code comprises a plurality of check nodes and a plurality of information nodes linked according to a defined connectivity, wherein the group of P information items comprises information items relating to at least one of the plurality of check nodes and to information nodes connected thereto, and wherein the decoding circuitry is configured to update the at least one check node and the information nodes connected thereto.

9. A decoding device according to claim 7, wherein said decoding circuitry comprises low-density parity-check (LDPC) decoding circuitry.

10. A decoding device according to claim 7, wherein said decorrelation modules form channel decoding circuitry based on a soft Viterbi algorithm.

11. A decoding device according to claim 7, wherein the electronic device comprises a communication system.

12. A decoding device according to claim 11, wherein the electronic device comprises a read chain for a hard disk.

13. A decoding device according to claim 7, wherein the electronic device comprises a communications system, the communications system further comprising a transmitter configured to encode the group of P decoded information items with an error correction code and to interleave the group of P decoded information items, and a transmission channel.

14. A decoding device according to claim 13, wherein the communications system defines a magnetic recording device.

15. A decoding device for use in an electronic device comprising:
    an input configured to receive a block of N information items encoded with a low-density parity-check (LDPC) error correction code and mutually correlated;

decorrelation circuitry comprising a plurality of soft output Viterbi algorithm decorrelation modules coupled in parallel to decorrelate the block, thereby generating a decorrelated block, a number of said plurality of decorrelation modules corresponding to a number of the P decoded information items;

a memory configured to store the decorrelated block;

decoding circuitry configured to decode the LDPC error correction code to thereby decode the decorrelated block in an iterative manner;

control circuitry configured to
- activate said decorrelation circuitry so as to carry out a first decorrelation of the N information items of the decorrelated block,
- activate said memory so as to store the decorrelated block,
- activate said decoding circuitry so as to decode a group of P information items of the decorrelated block,
- activate said decorrelation circuitry so as to decorrelate all of the P decoded information items, and
- repeat the activation of said decorrelation circuitry, said memory, said decoding circuitry, and said decorrelation circuitry with different successive groups of P information items of the decorrelated block until the N information items are processed; and management circuitry configured to activate said control circuitry until a decoding criterion is satisfied.

16. A decoding device according to claim 15, wherein the LDPC error correction code comprises a plurality of check nodes and a plurality of information nodes linked according to a defined connectivity, wherein the group of P information items comprises information items relating to at least one of the plurality of check nodes and to information nodes connected thereto, and wherein the decoding circuitry is configured to update the at least one check node and the information nodes connected thereto.

17. A decoding device according to claim 15, wherein the electronic device comprises a communication system.

18. A decoding device according to claim 17, wherein the electronic device comprises a read chain for a hard disk.

19. A decoding device according to claim 15, wherein the electronic device comprises a communications system, the communications system further comprising a transmitter configured to encode the group of P decoded information items with an error correction code and to interleave the group of P decoded information items, and a transmission channel.

20. A decoding device according to claim 15, wherein the communications system defines a magnetic recording device.

* * * * *